(12) United States Patent
Oh

(10) Patent No.: US 11,509,848 B2
(45) Date of Patent: Nov. 22, 2022

(54) PHOTODIODE ASSEMBLY

(71) Applicant: Microsoft Technology Licensing, LLC, Redmond, WA (US)

(72) Inventor: Minseok Oh, Santa Clara, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/146,199

(22) Filed: Jan. 11, 2021

(65) Prior Publication Data

US 2022/0224851 A1 Jul. 14, 2022

(51) Int. Cl.
| | |
|---|---|
| *H04N 5/374* | (2011.01) |
| *H04N 5/369* | (2011.01) |
| *H04N 5/378* | (2011.01) |
| *H01L 27/146* | (2006.01) |

(52) U.S. Cl.
CPC ....... *H04N 5/374* (2013.01); *H01L 27/14643* (2013.01); *H04N 5/36965* (2018.08)

(58) Field of Classification Search
CPC .. H04N 5/374; H04N 5/36965; H04N 5/3745; H04N 5/378; H01L 27/14643; H01L 27/14612
See application file for complete search history.

(56) References Cited

U.S. PATENT DOCUMENTS

| | | | | |
|---|---|---|---|---|
| 10,498,323 | B2* | 12/2019 | Abe | H04N 5/35554 |
| 10,923,515 | B2* | 2/2021 | Tadmor | H01L 27/14605 |
| 2009/0140305 | A1* | 6/2009 | Sugawa | H04N 5/374 |
| | | | | 257/292 |
| 2012/0249998 | A1* | 10/2012 | Eisele | G01S 7/4816 |
| | | | | 356/5.01 |
| 2018/0233528 | A1* | 8/2018 | Na | H01L 27/146 |
| 2019/0181169 | A1* | 6/2019 | Tadmor | H01L 27/14605 |

(Continued)

FOREIGN PATENT DOCUMENTS

WO 2019203057 A1 10/2019

OTHER PUBLICATIONS

"International Search Report and Written Opinion Issued in PCT Application No. PCT/US21/061688", dated Mar. 28, 2022, 13 Pages.

*Primary Examiner* — Marly S Camargo
(74) *Attorney, Agent, or Firm* — Alleman Hall Creasman & Tuttle LLP

(57) ABSTRACT

A photodiode assembly comprises a photoconductive substrate, including a P-doped region coupled with a controllable voltage biasing source, and an adjacent N-doped well. The photodiode assembly further comprises first and second capacitors coupled with the photoconductive substrate on first and second sides of the N-doped well. First and second control inputs are also coupled with the photoconductive substrate, wherein activation of the first control input causes electrons to flow through a first multiplication region of the N-doped well toward the first capacitor in response to photons striking the photoconductive substrate, and activation of the second control input causes electrons to flow through a second multiplication region of the N-doped well toward the second capacitor in response to photons striking the photoconductive substrate. Selectively controlling a voltage provided by the voltage biasing source changes a multiplication effect provided by the first and second multiplication regions of the N-doped well.

18 Claims, 6 Drawing Sheets

(56) References Cited

U.S. PATENT DOCUMENTS

| | | | |
|---|---|---|---|
| 2019/0319061 A1* | 10/2019 | Liu | H01L 27/148 |
| 2019/0370844 A1* | 12/2019 | Chen | H01L 27/14603 |
| 2020/0025928 A1* | 1/2020 | Gaalena | G01S 17/88 |
| 2020/0185439 A1* | 1/2020 | Jin | H01L 27/14614 |
| 2021/0025990 A1* | 1/2021 | Ozawa | G01S 7/4863 |
| 2021/0050300 A1* | 2/2021 | Lin | H01L 23/5389 |
| 2021/0067100 A1* | 3/2021 | Choi | H04N 5/351 |
| 2021/0242354 A1* | 8/2021 | Wang | H01L 31/0352 |
| 2021/0399689 A1* | 12/2021 | Choi | H03F 1/26 |
| 2022/0201232 A1* | 6/2022 | Oosako | H04N 5/378 |

* cited by examiner

PHOTODIODE ASSEMBLY

BACKGROUND

Depth cameras are configured to emit imaging light toward an environment, then receive the imaging light reflected off objects in the environment at an image sensor. Image sensors include a plurality of photoconductive pixels that generate electrical signals in response to light. The depth camera may generate an image depicting the environment based on the electrical signals produced by the image sensor.

DETAILED DESCRIPTION

As described above, depth cameras operate by emitting imaging light toward an environment, then receiving some of the imaging light reflected back by objects in the environment at an image sensor. The image sensor includes a plurality of pixels, each of which includes a photodiode configured to electrically respond to incoming light. Thus, by monitoring electrical conditions at each of the plurality of photodiodes, the depth camera can determine when light is received at the different pixels of the image sensor.

Different photodiode configurations can enable varying levels of imaging performance, influencing factors such as pixel size, sensor resolution, operating distance, power consumption, low-light performance, dark current amplification, applicability to 2D vs 3D imaging scenarios, etc. Such factors are influenced by the specific circuitry embedded within and around each photodiode. In designing photodiode assemblies, it is generally desirable to decrease pixel size, thereby increasing image sensor resolution, while also increasing operating distance, reducing power consumption and dark current amplification, and improving low-light performance.

To this end, the present disclosure is directed to a photodiode assembly in which a voltage biasing source, in tandem with first and second control inputs, influences flow of electrons within the photodiode assembly in response to light. In some examples, the controllable voltage biasing source may provide a negative voltage that reverse biases the photodiode assembly. In general, however, electrons generated in response to light flow through either a first or second multiplication region, ultimately reaching either a first or second capacitor, depending on whether the first or second control inputs are active. By evaluating the relative amounts of electrical charge accumulated by the two capacitors, the depth camera may determine pixel values for each pixel of the image sensor.

Furthermore, the photodiode assembly described herein may enable a reduction in overall pixel size, and therefore an increase in image sensor resolution. The photodiode assembly may further mitigate or alleviate amplification of dark current—i.e., the current generated in a photodiode even in the absence of light. Similarly, the photodiode assembly described herein may, in some scenarios, be applicable to either or both of 2D and 3D depth imaging techniques. For example, in 3D imaging scenarios, the photodiode assembly described herein may serve to increase the operating distance of the depth camera system, and/or decrease the power consumption of the light emitter. In 2D imaging scenarios, the photodiode assembly described herein may serve to enhance low-light performance, among other improvements.

Figure 1:
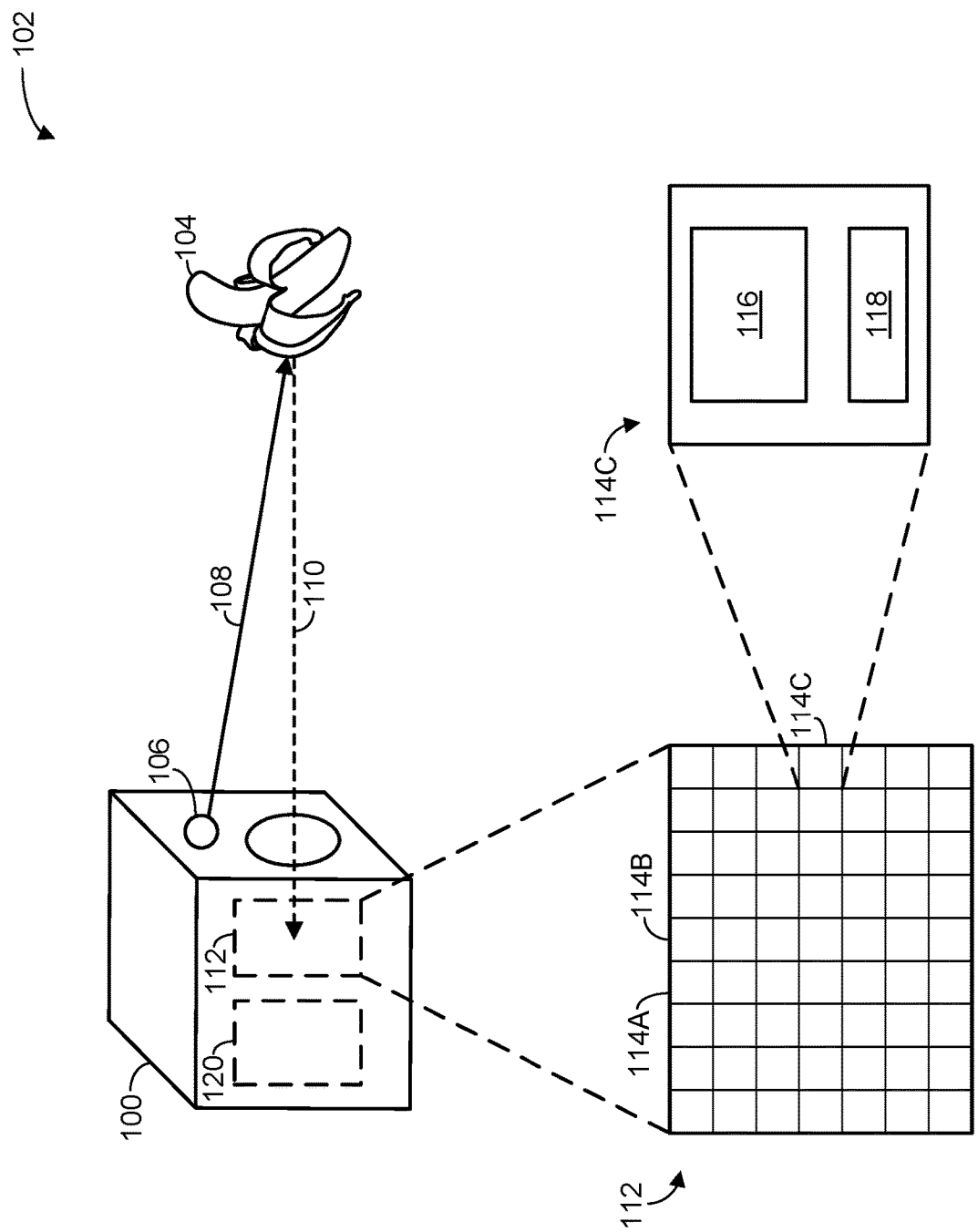
FIG. 1 schematically shows an example depth camera including an image sensor having a plurality of pixels.

FIG. 1 schematically shows an example depth camera system 100 configured to image a real-world environment 102. Real-world environment 102 includes an object 104 (in this case, a banana) to be imaged by the depth camera. The present disclosure primarily focuses on a 3D imaging scenario, in which the depth camera system outputs a 3D depth image based on the reflected imaging light, where pixel values of the depth image encode the distances between each pixel of the image sensor and objects in the real-world environment. Additionally, or alternatively, the depth camera system may be useable in a 2D imaging scenario—e.g., the imaging light may be used as a light source to produce 2D images of relatively dark environments.

In FIG. 1, depth camera 100 uses a light emitter 106 to emit imaging light 108 toward object 104 in real-world environment 102. The depth camera then receives reflected imaging light 110 at an image sensor 112, the reflected imaging light having reflected off object 104. The present disclosure primarily focuses on a scenario in which the depth camera is an indirect time-of-flight (ToF) depth camera configured to emit the imaging light as a continuous modulated light wave. The ToF depth camera may then determine the depths of objects in the scene by determining a phase difference between the imaging light wave and a reflected light wave received at the pixels of the image sensor, as will be described in more detail below. In other examples, however, the depth camera may be configured to emit imaging light and determine depth values for image sensor pixels in other suitable ways.

The imaging light, and thus the light emitter, may each take any suitable form. In one example, the imaging light may be infrared (IR) light, having a wavelength between 780 nm and 1 mm. In other examples, however, the imaging light may use other types of electromagnetic radiation having other suitable wavelengths. The light emitter may use any optical transmitter technology suitable for generating imaging light for 2D and/or 3D imaging—e.g., the imaging light may be emitted as a continuous modulated wave, spatially-varying pattern, or sequence of discrete pulses. As examples, the light emitter may include an array of one or more light emitting diodes (LED) or laser diodes.

As discussed above, the image sensor 112 includes a plurality of pixels, each independently configured to output electrical signals in response to light. FIG. 1 includes a zoomed-in view of image sensor 112, in which three specific pixels 114A, 114B, and 114C are labeled. FIG. 1 includes a further zoomed-in view of pixel 114C, showing that the pixel includes a photodiode assembly 116 and a pixel controller 118. As will be described in more detail below, electrical conditions within the photodiode assembly may be influenced by photons of light striking the photodiode assembly. The present disclosure generally focuses on a 3D imaging scenario, in which case the electrical conditions at each pixel may be quantified and processed to determine a depth value for the pixel—e.g., by pixel controller 118. It will be understood, however, that the photodiode assembly described herein may additionally, or alternatively, be used in 2D imaging scenarios. In any case, electrical conditions at each pixel of the image sensor may be interpreted to generate an image based on the reflected imaging light received at the imaging sensor.

For example, the pixel controller of each pixel may report some indication of the electrical conditions experienced at that pixel to a logic subsystem 120 of the depth camera. The logic subsystem may output the image of the real-world environment based on the received imaging light at each of the plurality of pixels of the image sensor. In some cases, depth camera system 100 may be implemented as computing system 700 described below with respect to FIG. 7. In such cases, logic subsystem 120 may be implemented as logic subsystem 702 of FIG. 7. Further details with respect to computing system 700 and logic subsystem 702 will be provided below with respect to FIG. 7.

It will be understood that FIG. 1 is schematic, highly simplified, and provided for illustration only. The sizes, shapes, and positions of the various components depicted in FIG. 1 are non-limiting and are not intended to depict a real usage scenario. In practical applications, the depth camera system, image sensor, and individual pixels of the image sensor may each include any number of additional components not depicted in FIG. 1, and/or omit or replace some components shown in FIG. 1. In general, the depth camera system, along with any computing components included within the depth camera system, may have any suitable configuration, form factor, and capabilities.

Figure 2A:
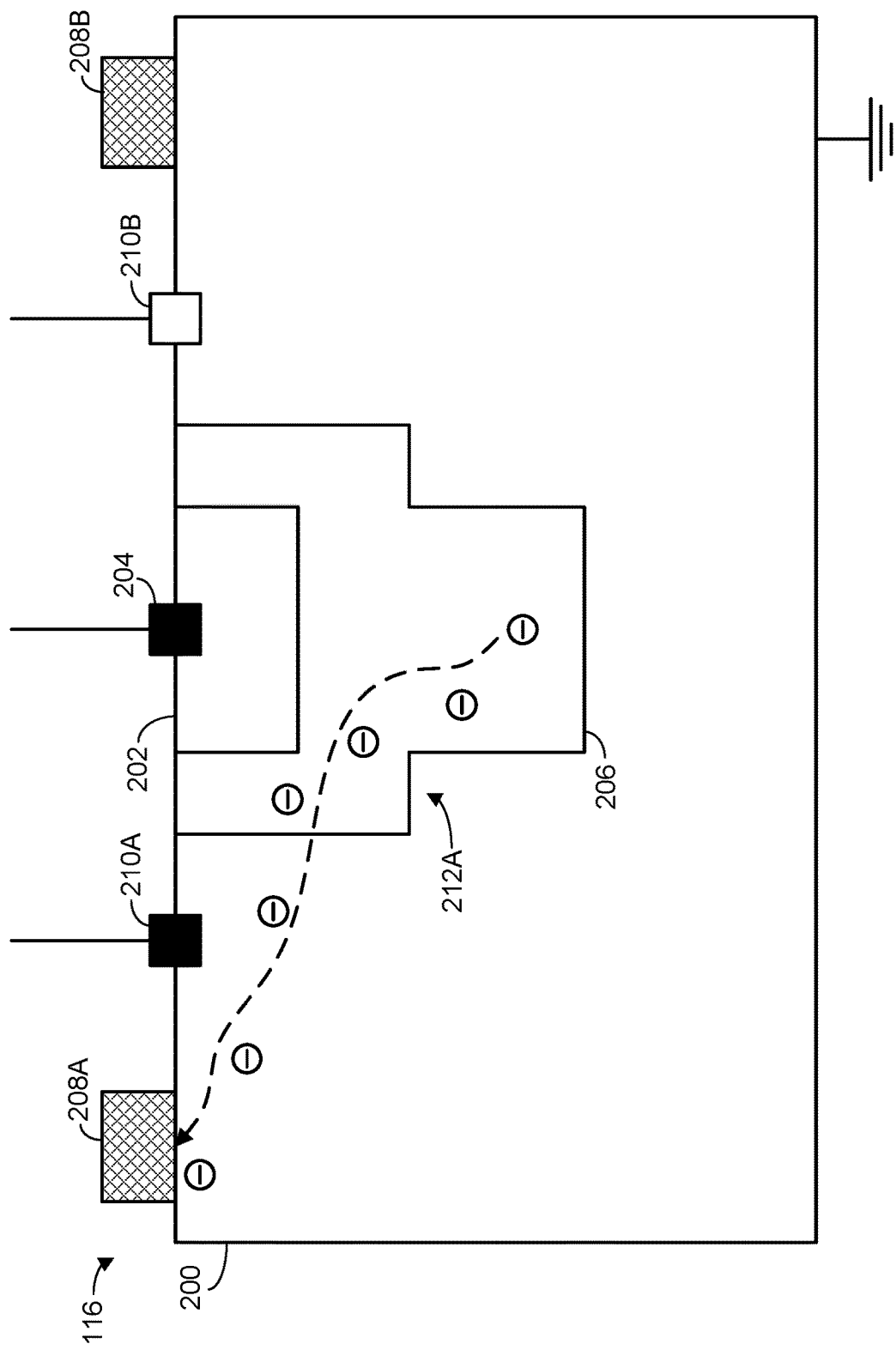
FIGS. 2A and 2B schematically depict an example photodiode assembly.
Figure 2B:
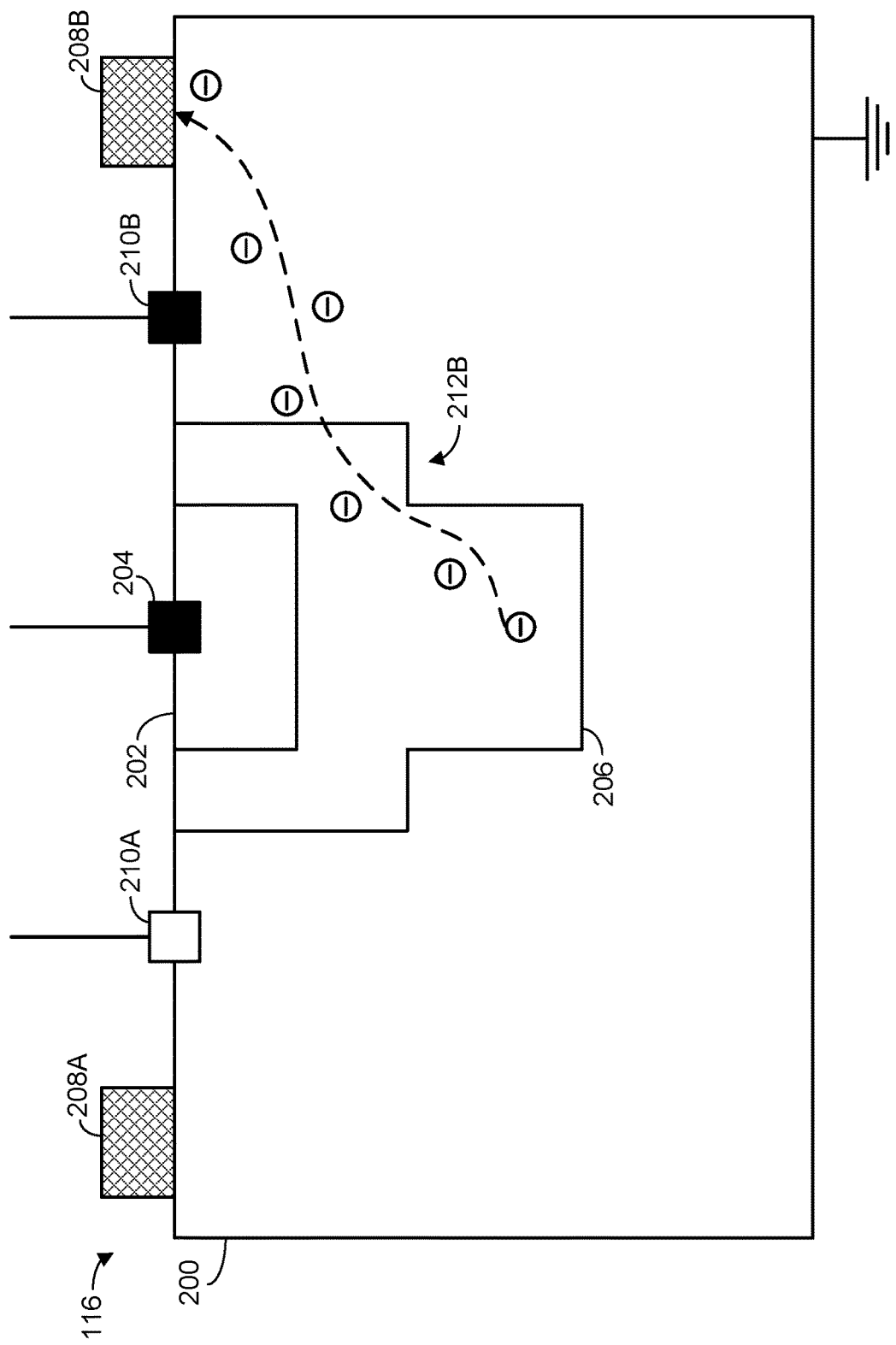

FIGS. 2A and 2B schematically provide a more detailed view of photodiode assembly 116, which may provide one or more of the advantages outlined above. As with FIG. 1, it will be understood that FIGS. 2A and 2B are highly simplified and non-limiting. As shown, photodiode assembly 116 includes a photoconductive substrate 200. The photoconductive substrate may be constructed from any suitable materials. As non-limiting examples, the photoconductive substrate may include silicon, germanium, lead sulfide, selenium, indium gallium arsenide, and/or a suitable organic photoconductive polymer. In general, the photoconductive substrate may include any suitable combination of materials that, when operatively coupled with suitable circuitry, enable electrical current generation in response to photons of light striking the photoconductive substrate. Because the photodiode assembly is a component of a particular pixel of an image sensor having a plurality of pixels, electrical current generated in each of the plurality of pixels may enable generation of an image depicting a surrounding real-world environment, as discussed above.

The photoconductive substrate includes a P-doped region 202 and an N-doped well 206 adjacent to the P-doped region. Any suitable semiconductor dopant materials may be used to form the P-doped region and N-doped well within the photoconductive substrate. As non-limiting examples, P-type dopant electron acceptors may include boron, gallium, aluminum, or indium, while N-type dopant electron donors may include phosphorus, antimony, or arsenic.

As shown in FIG. 2A, the P-doped region is coupled with a controllable voltage biasing source 204, configured to provide a controllable voltage that influences electrical conditions within the photoconductive substrate. In some cases, the voltage provided by the voltage biasing source may be a negative voltage that reverse biases the photodiode assembly. In other words, and contrary to typical diode operation, the P-doped region may be influenced by a negative voltage source, while the N-doped well may be influenced may be influenced by a positive voltage source, referred to as "reverse biasing" the diode.

The photodiode assembly also includes first and second capacitors 208A and 208B coupled with the photoconductive substrate on respective first and second sides of N-doped well 206. Capacitors 208A and 208B may each provide a different voltage input that influences the flow of current within the photoconductive substrate—e.g., a positive voltage that reverse biases the diode. In one example, the first and second capacitors may provide a voltage of +3.3 V, although other suitable voltages may be used depending on the implementation.

The extent to which the photodiode is reverse biased depends on the voltage differential between the negative voltage source influencing the P-doped region and the positive voltage source influencing the N-doped well. By increasing this voltage differential, the size of the depletion zone between the P-doped region and N-doped well increases, impeding the flow of current between the differently-doped regions of the photoconductive substrate. This effect intensifies until an avalanche point, where the electrical potential within the photoconductive substrate is high enough to cause a particular charge carrier (e.g., electron) to move with sufficient energy to dislodge additional charge carriers in its path, causing a chain reaction or "avalanche."

The voltage differential causing this reverse bias effect can be controlled by controlling either or both of the negative and positive voltage sources. In this example, the negative voltage biasing source is controllable, while the first and second capacitors provide a relatively fixed positive voltage source. In other examples, however, either or both of the negative and positive voltage sources may be controllable to provide a reverse bias effect.

By continuing to increase the voltage differential, the multiplication effect caused by reverse biasing the photodiode may increase until a breakdown point, where molecules within the photoconductive substrate become ionized and electrical current flows through the substrate even in the absence of the reverse biasing voltage sources. Operation of a photodiode beyond the breakdown voltage is sometimes referred to as "Geiger-mode." Geiger-mode photodiodes are often characterized by relatively large pixel sizes, and typically require several image frames before useful depth data can be derived. By contrast, the present disclosure is primarily directed to scenarios in which the negative voltage is controllable between zero volts and a Geiger-mode threshold voltage of the photodiode assembly. Such operation can be referred to as "linear mode," and enables smaller pixels, greater sensor resolution, and allows depth data to be determined from fewer image frames.

In short, because the photodiode assembly is reverse biased, photons striking the photoconductive substrate cause flow of electrical current within the substrate. The direction in which this electrical current flows can be influenced by control inputs coupled with the photoconductive substrate. Specifically, in FIG. 2A, first and second control inputs 210A and 210B are coupled with the photoconductive substrate, on sides of the N-doped well corresponding to first and second capacitors 208A and 208B. The first and second control inputs may be configured in such a way as to cause electrons to flow through a first multiplication region 212A of the N-doped well toward first capacitor 208A, when control input 210A is active and photons strike the photoconductive substrate. Specifically, the first multiplication region is proximate to the PN junction within the photodiode assembly. In some cases, the multiplication region may be spaced away from pixel defects such as gate oxide interface defects and surface defects, reducing the amplification of dark current.

This scenario is illustrated in FIG. 2A, showing electrons flowing from within the N-doped well toward first capacitor 208A. First control input 210 and controllable voltage source 204 are filled in black to indicate that they are actively providing voltage to the photoconductive substrate, while second control input 210B is filled in white to indicate that it is inactive. Because the photodiode assembly is reverse biased, electrons flowing through the multiplication region are multiplied, resulting in more overall current for each photon striking the photodiode assembly. It will be understood that the position of the multiplication region within the photoconductive substrate will vary from implementation to implementation depending on the specific electrical conditions within the substrate. Furthermore, in some cases the multiplication region need not be localized to any particular area within the photoconductive substrate, but rather may refer to a generalized effect that exists within the photoconductive substrate due to the electrical conditions caused by the various voltage sources.

Turning now to FIG. 2B, second control input 210B is active, while first control input 210A is inactive. Activation of the second control input causes electrons to flow through a second multiplication region 212B of the N-doped well toward second capacitor 208B, in response to photons striking the photoconductive substrate. As with the first multiplication region, the properties of the second multiplication region, and its position within the photoconductive substrate, will vary from implementation to implementation depending on the specific electrical conditions within the photodiode. Furthermore, the first and second multiplication regions need not be separate, but again may refer to a generalized effect within the photoconductive substrate caused by the reverse biasing voltage sources.

In any case, however, the multiplication region(s) may be influenced by the negative voltage provided by controllable voltage biasing source 204. As a result, controlling the negative voltage to be relatively more negative may increase the multiplication effect provided by the multiplication region(s). Similarly, controlling the negative voltage to be relatively less negative may decrease the multiplication effect. Again, the negative voltage may be controllable between zero volts and a Geiger-mode threshold of the photodiode assembly, corresponding to linear-mode operation of the photodiode. Either or both of the negative voltage source and positive voltage sources may be controlled through any suitable mechanism—e.g., the voltage sources may be communicatively coupled with pixel controller 118, which may set the voltages applied to the photodiode assembly.

In some cases, the negative voltage may be dynamically controllable—e.g., from one imaging frame to another. By using a relatively less negative voltage, the total power consumption may be reduced while improving dynamic range, at the expense of less signal and thus a worse signal-to-noise ratio (SNR). By contrast, using a relatively more negative voltage will result in a stronger signal and thus a higher SNR, at the expense of power consumption. Thus, the negative voltage may be controlled selectively to more or less negative depending on various operating conditions including ambient light level, device battery level, and whether the camera system is operating in a 2D or 3D imaging mode—e.g., to beneficially tune photodiode performance for the current conditions from frame to frame. In some cases, by setting the controllable voltage to zero volts, the avalanche effect may be eliminated, and the photodiode assembly may function as an ordinary demodulation pixel—e.g., for use in 2D imaging as opposed to 3D depth imaging. In other words, when the controllable voltage is biased at ground (0V), the pixel may be useable for either or both of 2D and 3D depth imaging, albeit without signal amplification as there is no longer an avalanche effect.

In any case, as described above, activation of the first or second control inputs causes electrical current to flow to the first or second capacitors, respectively, in response to photons striking the photoconductive substrate. This results in accumulation of electrical charge in the capacitor corresponding to the control input that is currently active. Thus, when the photodiode is exposed to light, such as during imaging of a real-world environment, the capacitor that accumulates charge will depend on which of the first and second control inputs is currently active. This property can be beneficially used to determine a phase difference between a modulated wave of imaging light emitted by the depth camera and detected at the photodiode assembly, and a reflected wave of image light returning after reflecting off an object in the environment, as will be described in more detail below.

Figure 3:
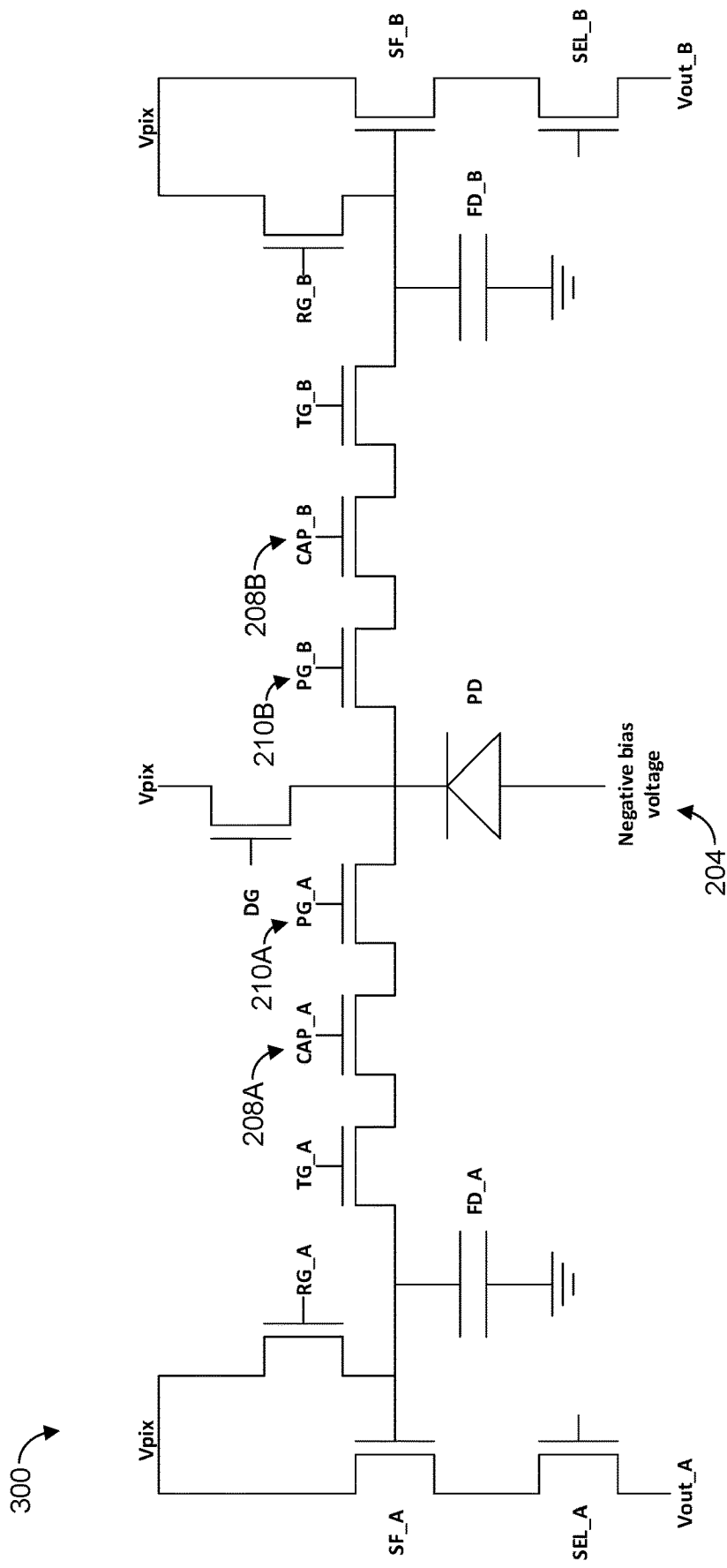
FIG. 3 shows an example circuit diagram for the photodiode assembly of FIGS. 2A and 2B.

FIG. 3 depicts an example circuit diagram 300 that may be useable to control photodiode 116 and enable the functionality described herein. As shown, voltage source 204, first and second capacitors 208A and 208B, along with the first and second control inputs 208A and 208B, are labeled within circuit diagram 300. Notably, the first and second control inputs are labeled as PG_A and PG_B. Other components within the circuit diagram include a drain gate DG, transfer gates TG_A and TG_B, reset gates RG_A and RG_B, source followers SF_A and SF_B, and selection gates SEL_A and SEL_B. Electrical charge accumulating in the first and second capacitors may propagate through other components within circuit diagram 300 to ultimately be reported to pixel controller 118. As discussed above, based on the electrical conditions within the photodiode assembly, the pixel controller may determine a pixel value for an image, and/or report data to a separate processing element (e.g., logic subsystem 120) useable to determine the pixel value.

Figure 4:
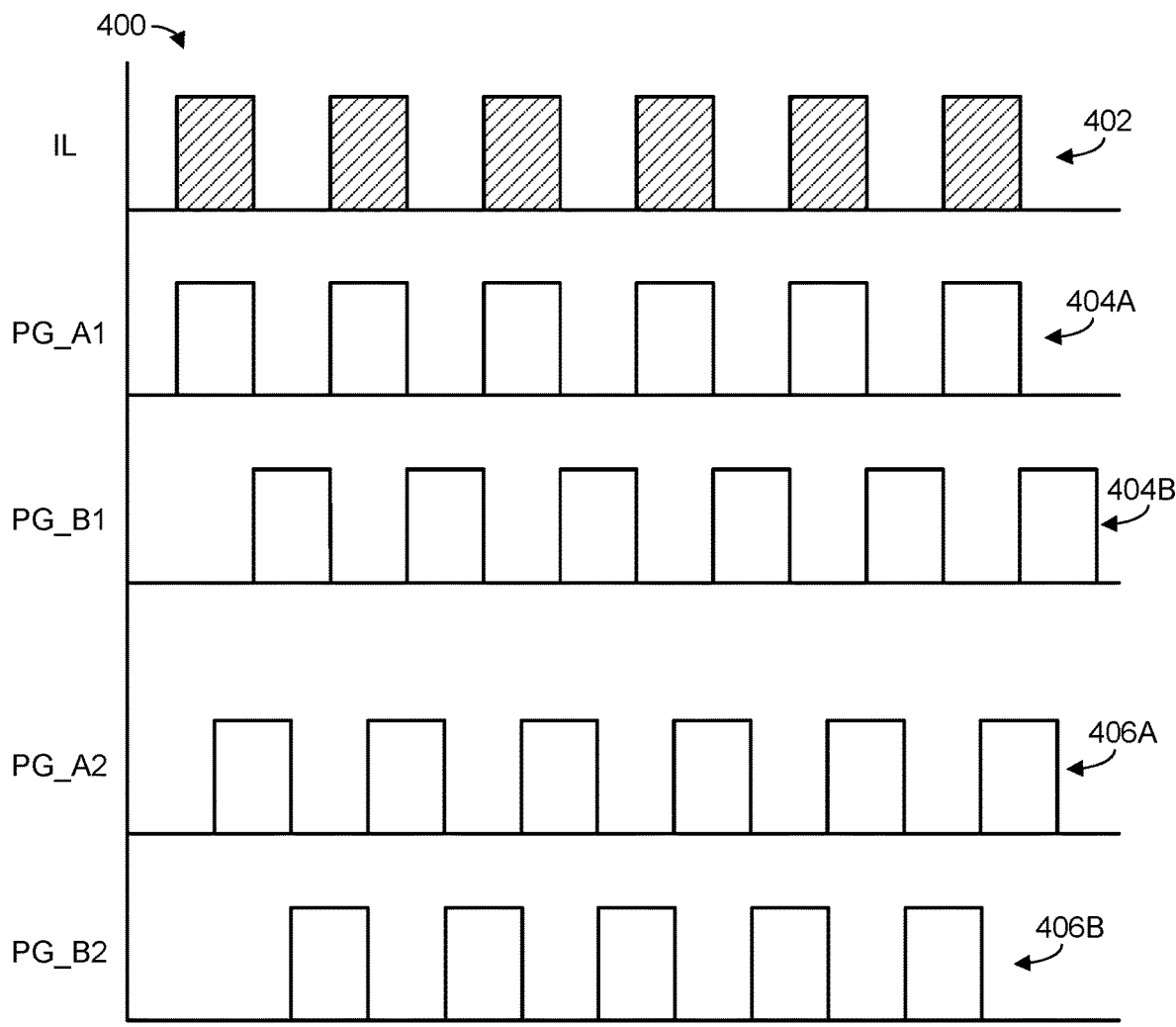
FIG. 4 shows a timing diagram for control inputs to the photodiode assembly of FIGS. 2A and 2B.

Turning now to FIG. 4, an example timing diagram 400 is shown indicating how the first and second control inputs may be beneficially controlled during imaging of a real-world environment. Specifically, as indicated by plot 402, imaging light is emitted by light emitter 106 of the depth camera as a plurality of imaging pulses. Such pulses may be discrete pulses—i.e., the light emitter may be powered on and off at a set temporal frequency. Alternatively, the imaging light may be emitted as a continuous modulated wave, and the plurality of pulses may be peaks in the continuous wave, again occurring at a set temporal frequency. The specific frequency used may vary from implementation to implementation—as a non-limiting example, the temporal frequency may range from 20 MHz to 400 MHz.

Plots 404A and 404B denote activity of the first and second control inputs during a first imaging frame. As shown, during the first imaging frame, the first control input is activated in a first plurality of discrete control pulses having the same phase as the plurality of imaging pulses. In other words, during each imaging pulse, the first control input is active. By contrast, the second control input is activated in a second plurality of discrete control pulses having the opposite phase from the first plurality of discrete control pulses. Thus, when the first control input is active, the second control input is inactive, and vice versa. Furthermore, the first control input is active when the imaging light is being emitted, and the second control input is active when the imaging light is not being emitted (or when the imaging light is being emitted with relatively less intensity, in the case of a continuous modulated imaging wave). Given this relationship, and in the absence of any reflected imaging light returning from the environment, the first capacitor will accumulate substantially more electrical charge during the first imaging frame than the second capacitor.

Continuing with FIG. 4, diagram 400 also includes plots 406A and 406B, denoting activity of the first and second control inputs during a second imaging frame. During the second imaging frame, the imaging light is still emitted in the same sequence of pulses as the first imaging frame, having substantially the same temporal frequency. By contrast, however, the first control input is activated in a third plurality of discrete control pulses that are 90 degrees out of phase with the first plurality of discrete control pulses. The second control input is activated in a fourth plurality of discrete control pulses having an opposite phase from the third plurality of control pulses, meaning the second control input again has an opposite phase from the first control input. However, because both control inputs are now activated 90 degrees out of phase as compared to the first imaging frame, they will each be active for similar amounts of time during emission of imaging light. Given this relationship, and again ignoring any reflected imaging light returning from the environment, the first and second capacitors will accumulate similar amounts of electrical charge.

However, after each pulse of imaging light is emitted, the image sensor will receive a corresponding pulse of reflected imaging light returning from the environment after reflecting off objects in the environment. Notably, the reflected imaging light will be received as a plurality of pulses that are out of phase from the emitted imaging light, and the extent of this phase difference will be proportional to the distance between the depth camera and the object that the imaging light was reflected by. In other words, when objects are relatively further from the depth camera, the elapsed time between a photon of imaging light being emitted, and later being received as reflected imaging light, will be relatively longer than when then object is relatively closer to the camera. This will correspond to a relatively larger phase difference when the objects imaged by the depth camera are relatively further away, and a smaller phase difference when the objects are relatively closer.

When a photodiode receives reflected imaging light, it will cause flow of electrical current toward a capacitor of the first and second capacitors, depending on which of the first and second control inputs is currently active. This will affect the amount of electrical charge accumulated by the first and second capacitors during the first and second imaging frames described above. In other words, because reflected imaging light returns to the image sensor, the amount of electrical charge accumulated by the first and second capacitors during each imaging frame will differ from the amount of charge that would be accumulated in the absence of reflected imaging light. From this, the pixel controller, and/or other processing component of the depth camera, may be configured to output a depth value for the pixel during a readout phase by comparing relative amounts of electrical charge accumulated by the first and second capacitors during the first and second imaging frames.

To illustrate this, during the second imaging frame, each of the first and second control inputs are activated with pulses that are 90 degrees out of phase with the emitted imaging light. Thus, as described above, the first and second capacitors would accumulate relatively equal amounts of electrical charge in the absence of any reflected imaging light, or other environment light not emitted by the depth camera. However, receiving pulses of reflected imaging light that are out of phase with the emitted imaging light will alter this relationship—e.g., during the second imaging frame, the first capacitor may accumulate 80% of the total electrical charge, while the second capacitor accumulates 20%. This difference between the expected accumulated charges and the actual accumulated charges can be used to derive the phase difference between the emitted imaging light and reflected imaging light, and in turn, output a depth value for the pixel.

The above timing relationships can be characterized as a "two phase" arrangement, in which control inputs are activated differently in two different imaging frames. It will be understood, however, that this is merely a non-limiting example. In other approaches, more than two phases may be used—e.g., the different control inputs may be activated differently in three or more different imaging frames. Furthermore, in some cases, the temporal frequency with which the imaging light is emitted and control inputs are activated may vary from one phase to another. In other words, one temporal frequency may be used during the first phase, while a different temporal frequency may be used during the second phase.

Figure 5:
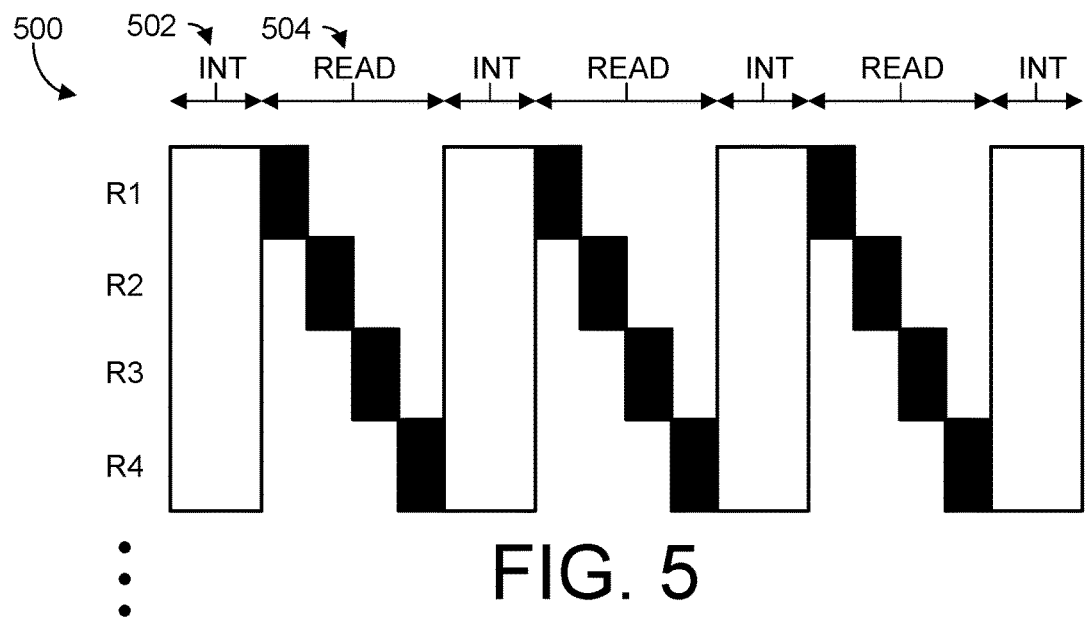
FIG. 5 illustrates a timing diagram for readout of pixels of an image sensor.

During imaging of an environment, pixels of the image sensor may be exposed to light during an integration phase, then values of individual pixels may be read during a readout phase. This is schematically illustrated with respect to FIG. 5, showing an example timing diagram 500 for readout of pixels of an image sensor. In this example, the plurality of pixels of the image sensor are arranged as a plurality of rows that are individually addressable. In diagram 500, different rows of pixels are indicated by R1 (row 1), R2 (row 2) and so on. As shown, all of the pixel rows are exposed to light during an integration phase 502. The integration phase may therefore include the first and second imaging frames as discussed above, where the first and second (and/or subsequent) imaging frames may be repeated any number of times during the integration phase. Notably, in this example, the image sensor uses a global shutter, such that each of the plurality of pixels are exposed at once. In other examples, however, a rolling shutter may be used, in which case different rows or columns of pixels may be exposed at different times.

Continuing with FIG. 5, depth values for each row of pixels are read out sequentially row by row during a readout phase 504. Specifically, as shown, pixel values are first read for R1, then separately for R2, and so on. In other examples, however, the pixel values for every row may be read at once, or pixel values for different pixels may be read sequentially in a manner that does not include reading the pixels row by row. Pixel values may be read by any suitable processing component of the depth camera system—e.g., by logic subsystem 120 and/or logic subsystem 702 described below with respect to FIG. 7.

As discussed above, pixel values from each of the plurality of pixels of the image sensor may be combined to give an image depicting the real-world environment. In 3D imaging scenarios, the pixel values may be depth values, and may be combined into a depth image that encodes the distances between the depth camera and imaged objects in the real-world environment.

Figure 6:
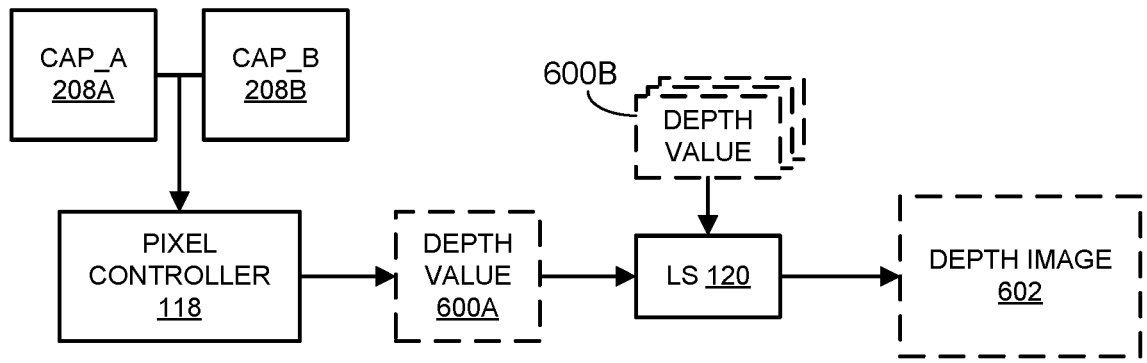
FIG. 6 schematically illustrates determining depth values for pixels of an image sensor.

This is shown in FIG. 6, which schematically illustrates the process of outputting a depth image. As shown, pixel controller 118 interprets electrical conditions at the first and second capacitors 208A and 208B. As described above, the first and second capacitors may accumulate different amounts of electrical charge during an integration phase, and this difference depends on the relative amounts of emitted imaging light and reflected imaging light received by the photodiode during different imaging frames of the integration phase. Thus, by comparing the relative amounts of electrical charge accumulated by the capacitors, a depth value 600A for the pixel may be determined. The depth value may in some cases by determined by pixel controller 118, or by a different processing component of the depth camera system.

In FIG. 6, depth value 600A is received by logic subsystem 120, which combines depth value 600B with a plurality of additional depth values corresponding to other pixels of the image sensor, including a depth value 600B. The combination of depth values corresponding to different pixels is output as a depth image 602.

The methods and processes described herein may be tied to a computing system of one or more computing devices. In particular, such methods and processes may be implemented as an executable computer-application program, a network-accessible computing service, an application-programming interface (API), a library, or a combination of the above and/or other compute resources.

Figure 7:
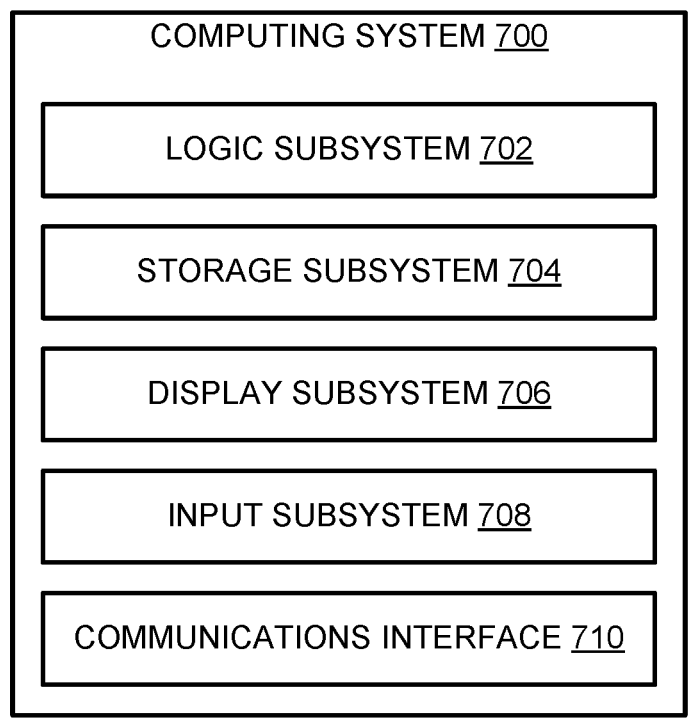
FIG. 7 schematically shows an example computing system.

FIG. 7 schematically shows a simplified representation of a computing system 700 configured to provide any to all of the compute functionality described herein. Computing system 700 may take the form of one or more personal computers, network-accessible server computers, tablet computers, home-entertainment computers, gaming devices, mobile computing devices, mobile communication devices (e.g., smart phone), virtual/augmented/mixed reality computing devices, wearable computing devices, Internet of Things (IoT) devices, embedded computing devices, and/or other computing devices.

Computing system 700 includes a logic subsystem 702 and a storage subsystem 704. Computing system 700 may optionally include a display subsystem 706, input subsystem 708, communication subsystem 710, and/or other subsystems not shown in FIG. 7.

Logic subsystem 702 includes one or more physical devices configured to execute instructions. For example, the logic subsystem may be configured to execute instructions that are part of one or more applications, services, or other logical constructs. The logic subsystem may include one or more hardware processors configured to execute software instructions. Additionally, or alternatively, the logic subsystem may include one or more hardware or firmware devices configured to execute hardware or firmware instructions. Processors of the logic subsystem may be single-core or multi-core, and the instructions executed thereon may be configured for sequential, parallel, and/or distributed processing. Individual components of the logic subsystem optionally may be distributed among two or more separate devices, which may be remotely located and/or configured for coordinated processing. Aspects of the logic subsystem may be virtualized and executed by remotely-accessible, networked computing devices configured in a cloud-computing configuration.

Storage subsystem 704 includes one or more physical devices configured to temporarily and/or permanently hold computer information such as data and instructions executable by the logic subsystem. When the storage subsystem includes two or more devices, the devices may be collocated and/or remotely located. Storage subsystem 704 may include volatile, nonvolatile, dynamic, static, read/write, read-only, random-access, sequential-access, location-addressable, file-addressable, and/or content-addressable devices. Storage subsystem 704 may include removable and/or built-in devices. When the logic subsystem executes instructions, the state of storage subsystem 704 may be transformed—e.g., to hold different data.

Aspects of logic subsystem 702 and storage subsystem 704 may be integrated together into one or more hardware-logic components. Such hardware-logic components may include program- and application-specific integrated circuits (PASIC/ASICs), program- and application-specific standard products (PSSP/ASSPs), system-on-a-chip (SOC), and complex programmable logic devices (CPLDs), for example.

The logic subsystem and the storage subsystem may cooperate to instantiate one or more logic machines. As used herein, the term "machine" is used to collectively refer to the combination of hardware, firmware, software, instructions, and/or any other components cooperating to provide computer functionality. In other words, "machines" are never abstract ideas and always have a tangible form. A machine may be instantiated by a single computing device, or a machine may include two or more sub-components instantiated by two or more different computing devices. In some implementations a machine includes a local component (e.g., software application executed by a computer processor) cooperating with a remote component (e.g., cloud computing service provided by a network of server computers). The software and/or other instructions that give a particular machine its functionality may optionally be saved as one or more unexecuted modules on one or more suitable storage devices.

When included, display subsystem 706 may be used to present a visual representation of data held by storage subsystem 704. This visual representation may take the form of a graphical user interface (GUI). Display subsystem 706 may include one or more display devices utilizing virtually any type of technology. In some implementations, display subsystem may include one or more virtual-, augmented-, or mixed reality displays.

When included, input subsystem 708 may comprise or interface with one or more input devices. An input device may include a sensor device or a user input device. Examples of user input devices include a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition.

When included, communication subsystem 710 may be configured to communicatively couple computing system 700 with one or more other computing devices. Communication subsystem 710 may include wired and/or wireless communication devices compatible with one or more different communication protocols. The communication subsystem may be configured for communication via personal-, local- and/or wide-area networks.

This disclosure is presented by way of example and with reference to the associated drawing figures. Components, process steps, and other elements that may be substantially the same in one or more of the figures are identified coordinately and are described with minimal repetition. It will be noted, however, that elements identified coordinately may also differ to some degree. It will be further noted that some figures may be schematic and not drawn to scale. The various drawing scales, aspect ratios, and numbers of components shown in the figures may be purposely distorted to make certain features or relationships easier to see.

In an example, a photodiode assembly comprises: a photoconductive substrate including: a P-doped region coupled with a controllable voltage biasing source; and an N-doped well adjacent to the P-doped region; first and second capacitors coupled with the photoconductive substrate on respective first and second sides of the N-doped well; first and second control inputs coupled with the photoconductive substrate, wherein activation of the first control input causes electrons to flow through a first multiplication region of the N-doped well toward the first capacitor in response to photons striking the photoconductive substrate, and activation of the second control input causes electrons to flow through a second multiplication region of the N-doped well toward the second capacitor in response to photons striking the photoconductive substrate; and wherein selectively controlling a voltage provided by the voltage biasing source changes a multiplication effect provided by the first and second multiplication regions of the N-doped well. In this example or any other example, the voltage provided by the voltage biasing source is a negative voltage that reverse biases the photodiode assembly. In this example or any other example, the negative voltage is controllable between zero volts and a Geiger-mode threshold voltage of the photodiode assembly. In this example or any other example, controlling the negative voltage to be relatively more negative increases the multiplication effect provided by the first and second multiplication regions. In this example or any other example, the negative voltage is controlled based on one or more operating conditions including ambient light level, device battery level, and camera imaging mode. In this example or any other example, the photodiode assembly is a component of a particular pixel of an image sensor having a plurality of pixels. In this example or any other example, the image sensor uses a global shutter, such that each of the plurality of pixels are exposed at once. In this example or any other example, the image sensor is a component of an indirect time-of-flight (TOF) depth camera configured to emit imaging light toward a real-world environment, receive imaging light reflected by objects in the real-world environment, and output a depth image of the real-world environment based on the received imaging light. In this example or any other example, during a first imaging frame, the imaging light is emitted as a plurality of imaging pulses, the first control input is activated in a first plurality of discrete control pulses having a same phase as the plurality of imaging pulses, and the second control input is activated in a second plurality of discrete control pulses having an opposite phase from the first plurality of discrete control pulses. In this example or any other example, during a second imaging frame, the imaging light is emitted as the plurality of imaging pulses, the first control input is activated in a third plurality of discrete control pulses 90 degrees out of phase with the first plurality of discrete control pulses, and the second control input is activated in a fourth plurality of discrete control pulses having an opposite phase from the third plurality of discrete control pulses. In this example or any other example, a pixel controller is configured to determine a depth value for the particular pixel during a readout phase by comparing relative amounts of electrical charge accumulated by the first and second capacitors during the first and second imaging frames. In this example or any other example, the plurality of pixels of the image sensor are arranged as a plurality of rows, and wherein depth values for each row of pixels are read out sequentially row by row.

In an example, an indirect time-of-flight (TOF) depth camera system comprises: a light emitter configured to emit imaging light toward objects in a real-world environment; and an image sensor comprising a plurality of pixels configured to receive imaging light reflected by the objects in the real-world environment, each of the plurality of pixels including a photodiode assembly, and each photodiode assembly comprising: a photoconductive substrate, including: a P-doped region coupled with a controllable voltage biasing source; and an N-doped well adjacent to the P-doped region; first and second capacitors coupled with the photoconductive substrate on respective first and second sides of the N-doped well; first and second control inputs coupled with the photoconductive substrate, wherein activation of the first control input causes electrons to flow through a first multiplication region of the N-doped well toward the first capacitor in response to photons striking the photoconductive substrate, and wherein activation of the second control input causes electrons to flow through a second multiplication region of the N-doped well toward the second capacitor in response to photons striking the photoconductive substrate; and wherein selectively controlling a voltage provided by the voltage biasing source changes a multiplication effect provided by the first and second multiplication regions of the N-doped well. In this example or any other example, the voltage provided by the voltage biasing source is a negative voltage that reverse biases the photodiode assembly. In this example or any other example, the negative voltage is controllable between zero volts and a Geiger-mode threshold voltage of the photodiode assembly. In this example or any other example, controlling the negative voltage to be relatively more negative increases the multiplication effect provided by the first and second multiplication regions. In this example or any other example, the image sensor uses a global shutter, such that each of the plurality of pixels are exposed at once. In this example or any other example, the depth camera system further comprises a logic subsystem configured to output a depth image of the real-world environment based on the received imaging light at each of the plurality of pixels of the image sensor. In this example or any other example, depth values for each image pixel of the depth image are determined based on relative amounts of electrical charge accumulated by the first and second capacitors.

In an example, a pixel of an image sensor comprises: a photoconductive substrate, including: a P-doped region coupled with a controllable voltage biasing source configured to provide a negative voltage that reverse biases the photodiode assembly; and an N-doped well adjacent to the P-doped region; first and second capacitors coupled with the photoconductive substrate on respective first and second sides of the N-doped well; first and second control inputs coupled with the photoconductive substrate, wherein activation of the first control input causes electrons to flow through a first multiplication region of the N-doped well toward the first capacitor in response to photons striking the photoconductive substrate, and activation of the second control input causes electrons to flow through a second multiplication region of the N-doped well toward the second capacitor in response to photons striking the photoconductive substrate; wherein selectively controlling the negative voltage provided by the controllable voltage biasing source changes a multiplication effect provided by the first and second multiplication regions of the N-doped well; and a pixel controller configured to output a depth value for the pixel, the depth value determined based on relative amounts of electrical charge accumulated by the first and second capacitors.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A photodiode assembly, comprising:
   a photoconductive substrate, including:
      a P-doped region coupled with a controllable voltage biasing source; and
      an N-doped well adjacent to the P-doped region;
   first and second capacitors coupled with the photoconductive substrate on respective first and second sides of the N-doped well;
   first and second control inputs coupled with the photoconductive substrate, wherein activation of the first control input causes electrons to flow through a first multiplication region of the N-doped well toward the first capacitor in response to photons striking the photoconductive substrate, and activation of the second control input causes electrons to flow through a second multiplication region of the N-doped well toward the second capacitor in response to photons striking the photoconductive substrate;
   wherein selectively controlling a voltage provided by the voltage biasing source changes a multiplication effect provided by the first and second multiplication regions of the N-doped well; and
   wherein the photodiode assembly is a component of a pixel of an image sensor having a plurality of pixels, and a pixel controller is configured to determine a depth value for the pixel by comparing relative amounts of electrical charge accumulated by the first and second capacitors.

2. The photodiode assembly of claim 1, wherein the voltage provided by the voltage biasing source is a negative voltage that reverse biases the photodiode assembly.

3. The photodiode assembly of claim 2, wherein the negative voltage is controllable between zero volts and a Geiger-mode threshold voltage of the photodiode assembly.

4. The photodiode assembly of claim 3, wherein controlling the negative voltage to be relatively more negative increases the multiplication effect provided by the first and second multiplication regions.

5. The photodiode assembly of claim 4, wherein the negative voltage is controlled based on one or more operating conditions including ambient light level, device battery level, and camera imaging mode.

6. The photodiode assembly of claim 1, wherein the image sensor uses a global shutter, such that each of the plurality of pixels are exposed at once.

7. The photodiode assembly of claim 1, wherein the image sensor is a component of an indirect time-of-flight (TOF) depth camera configured to emit imaging light toward a real-world environment, receive imaging light reflected by objects in the real-world environment, and output a depth image of the real-world environment based on the received imaging light.

8. The photodiode assembly of claim78, wherein, during a first imaging frame, the imaging light is emitted as a plurality of imaging pulses, the first control input is activated in a first plurality of discrete control pulses having a same phase as the plurality of imaging pulses, and the second control input is activated in a second plurality of discrete control pulses having an opposite phase from the first plurality of discrete control pulses.

9. The photodiode assembly of claim 8, wherein, during a second imaging frame, the imaging light is emitted as the plurality of imaging pulses, the first control input is activated in a third plurality of discrete control pulses 90 degrees out of phase with the first plurality of discrete control pulses, and the second control input is activated in a fourth plurality of discrete control pulses having an opposite phase from the third plurality of discrete control pulses.

10. The photodiode assembly of claim 9, wherein the pixel controller is configured to determine the depth value for the pixel during a readout phase after the first and second imaging frames.

11. The photodiode assembly of claim 10, wherein the plurality of pixels of the image sensor are arranged as a plurality of rows, and wherein depth values for each row of pixels are read out sequentially row by row.

12. An indirect time-of-flight (TOF) depth camera system, comprising:
   a light emitter configured to emit imaging light toward objects in a real-world environment; and
   an image sensor comprising a plurality of pixels configured to receive imaging light reflected by the objects in the real-world environment, each of the plurality of pixels including a photodiode assembly, and each photodiode assembly comprising:
      a photoconductive substrate, including:
         a P-doped region coupled with a controllable voltage biasing source; and
         an N-doped well adjacent to the P-doped region;
      first and second capacitors coupled with the photoconductive substrate on respective first and second sides of the N-doped well;
      first and second control inputs coupled with the photoconductive substrate, wherein activation of the first control input causes electrons to flow through a first multiplication region of the N-doped well toward the first capacitor in response to photons striking the photoconductive substrate, and wherein activation of the second control input causes electrons to flow through a second multiplication region of the N-doped well toward the second capacitor in response to photons striking the photoconductive substrate; and wherein selectively controlling a voltage provided by the voltage biasing source changes a multiplication effect provided by the first and second multiplication regions of the N-doped well; and a pixel controller configured to determine a depth value for a pixel of the plurality of pixels by comparing relative amounts of electrical charge accumulated by the first and second capacitors.

13. The indirect TOF depth camera system of claim 12, wherein the voltage provided by the voltage biasing source is a negative voltage that reverse biases the photodiode assembly.

14. The indirect TOF depth camera system of claim 13, wherein the negative voltage is controllable between zero volts and a Geiger-mode threshold voltage of the photodiode assembly.

15. The indirect TOF depth camera system of claim 14, wherein controlling the negative voltage to be relatively more negative increases the multiplication effect provided by the first and second multiplication regions.

16. The indirect TOF depth camera system of claim 12, wherein the image sensor uses a global shutter, such that each of the plurality of pixels are exposed at once.

17. The indirect TOF depth camera system of claim 12, further comprising a logic subsystem configured to output a depth image of the real-world environment based on the received imaging light at each of the plurality of pixels of the image sensor.

18. A pixel of an image sensor, comprising:
a photoconductive substrate, including:
   a P-doped region coupled with a controllable voltage biasing source configured to provide a negative voltage that reverse biases the photodiode assembly; and
   an N-doped well adjacent to the P-doped region;
first and second capacitors coupled with the photoconductive substrate on respective first and second sides of the N-doped well;
first and second control inputs coupled with the photoconductive substrate, wherein activation of the first control input causes electrons to flow through a first multiplication region of the N-doped well toward the first capacitor in response to photons striking the photoconductive substrate, and activation of the second control input causes electrons to flow through a second multiplication region of the N-doped well toward the second capacitor in response to photons striking the photoconductive substrate;
wherein selectively controlling the negative voltage provided by the controllable voltage biasing source changes a multiplication effect provided by the first and second multiplication regions of the N-doped well; and
a pixel controller configured to output a depth value for the pixel, the depth value determined based on relative amounts of electrical charge accumulated by the first and second capacitors.

* * * * *